(12) United States Patent
Oshima (10) Patent No.: US 8,170,168 B2
(45) Date of Patent: May 1, 2012

(54) CLOCK DATA RECOVERY CIRCUIT

(75) Inventor: Yoshinobu Oshima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 213 days.

(21) Appl. No.: 12/654,204

(22) Filed: Dec. 14, 2009

(65) Prior Publication Data

US 2010/0148832 A1    Jun. 17, 2010

(30) Foreign Application Priority Data

Dec. 16, 2008 (JP) .................................. 2008-319702

(51) Int. Cl.
*H04L 7/02* (2006.01)

(52) U.S. Cl. .................. 375/359; 375/355; 375/371

(58) Field of Classification Search .................. 375/355, 375/359, 371
See application file for complete search history.

(56) References Cited

U.S. PATENT DOCUMENTS

| | | | |
|---|---|---|---|
| 6,526,109 B1 * | 2/2003 | Chang et al. .................. | 375/371 |
| 6,753,712 B2 | 6/2004 | Saeki | |
| 7,323,917 B2 * | 1/2008 | Cho et al. ...................... | 327/158 |
| 7,684,531 B2 * | 3/2010 | Masui et al. .................. | 375/355 |
| 7,756,232 B2 * | 7/2010 | Aoki et al. ..................... | 375/355 |
| 7,912,167 B2 * | 3/2011 | Saeki ............................. | 375/355 |
| 7,912,169 B2 * | 3/2011 | Saeki et al. .................... | 375/362 |
| 7,929,644 B2 * | 4/2011 | McCune, Jr. .................. | 375/326 |
| 2003/0214335 A1 | 11/2003 | Saeki | |
| 2005/0238126 A1 * | 10/2005 | Ribo et al. ..................... | 375/355 |

FOREIGN PATENT DOCUMENTS

| | | |
|---|---|---|
| EP | 1 225 698 | 7/2002 |
| JP | 2003-333021 A | 11/2003 |
| WO | 2006/128114 | 11/2006 |

OTHER PUBLICATIONS

European Search Report dated Mar. 26, 2010.
Behzad Razavi: "Challenges in the Design of High-Speed Clock and Data Recovery Circuits" IEEE Communications Magazine, IEEE Service Center, Piscataway, US, vol. 40, No. 8, Aug. 1, 2002, pp. 94-101, XP011092903, ISSN: 0163-6804.

* cited by examiner

*Primary Examiner* — Lincoln Donovan
*Assistant Examiner* — Adam Houston
(74) *Attorney, Agent, or Firm* — McGinn IP Law Group, PLLC (57) ABSTRACT

A simple circuit that supports high and low data rates is provided. The circuit includes: a detection circuit 11 for detecting whether $D1 \neq D2$ or $D1 \neq D3$, assuming that logical values of an input data signal DATAIN sampled at timings $t1$, $t2$, and $t3$ ($t2<t1<t3$) of edges of clock signals CLK0 and CLK1 are D1, D2, and D3, respectively; and a clock generation circuit 14 for changing phases of the clock signals CLK0 and CLK1 based on detection results from the detection circuit 11, so that timings at which the logical values of the input data signal DATAIN change correspond to the timings $t2$ and $t3$.

4 Claims, 6 Drawing Sheets

CLOCK DATA RECOVERY CIRCUIT

FIELD OF THE INVENTION

Reference to Related Application

This application is based upon and claims the benefit of the priority of Japanese patent application No. 2008-319702 filed on Dec. 16, 2008, the disclosure of which is incorporated herein in its entirety by reference thereto.

The present invention relates to a clock data recovery (CDR) circuit, and in particular to a CDR circuit that reproduces a clock signal synchronized with input serial data and outputs a data signal.

BACKGROUND

Digital serial transmission is widely used in many fields and devices, such as in the communication network system or for PCI Express, Serial ATA (SATA), and the like in a personal computer. In the communication system, for example, the International Telecommunication Union (ITU) defines standards for various data rates from a low speed (1.5 Mbps) to a high speed (10 Gbps) as Synchronous Digital Hierarchy (SDH). SDH transmission equipment is often required to support many data rates, instead of a single data rate, by changing the setting thereof. For example, there are cases where equipment including a Synchronous Transfer Mode (STM), which is an optical transmission system, needs to support data rates such as STM1 (155.52 Mbps), STM4 (622.08 Mbps), and STM16 (2.48832 Gbps) by changing the setting thereof.

In digital serial transmission, a clock data recovery circuit is used. Based on the circuit, while clock signals are not transmitted, data signals are transmitted. When receiving data, the receiving end reproduces a clock synchronized with the data. As an example of such clock data recovery circuit, Patent Document 1 discloses a clock and data recovery circuit using multiphase clocks. This circuit comprises a phase-shift circuit for shifting phases of the multiphase clocks and outputting the resultant clock signals. According to this document, input data is latched by multiphase clocks outputted from the phase-shift circuit, and based on the latched data, the relationship between a phase of data transition and phases of the multiphase clocks is detected. By controlling the phase-shift circuit based on the relationship so that the phases of the multiphase clocks follow the data transition, a clock synchronized with the input data is reproduced.

Patent Document 1: Japanese Patent Kokai Publication No. JP-P2003-333021A

SUMMARY

The entire disclosure of Patent Document 1 is incorporated herein by reference thereto. Analysis will be hereinafter made based on the present invention.

Based on the clock and data recovery circuit disclosed in Patent Document 1, it is necessary to change the frequency of the multiphase clocks depending on a data rate. For example, if 2.5 Gbps data is handled by a two-phase clock of 2.5 GHz, in order to use the circuit at a data rate of 1.25 Gbps, a two-phase clock of 1.25 GHz needs to be employed. This means that the phase-shift circuit comprised of analog circuits needs to operate at the two frequencies of 1.25 GHz and 2.5 GHz. Generally, when configuring an analog circuit to operate at a wider frequency range, design difficulty in obtaining desired circuit characteristics is increased.

For example, interpolators in the phase-shift circuit disclosed in Patent Document 1 receive input clocks (IN1, IN2) having a delay difference and discharge electric charges stored in capacitors by changing the number of N-channel transistors that turns on/off at change timings of the input clocks (IN1, IN2). In this way, the phase of an output clock waveform is controlled.

This circuit changes the capacitances of capacitors to support a high-speed clock to a low-speed clock. Since the circuit needs to include large-capacitance capacitors for a low-speed clock, when realized as a large-scale integration (LSI), the area of the interpolators is increased. Further, the circuit generates waveforms through charge and discharge of the capacitors, variations of the device characteristics, such as capacitance values of capacitors and performance of transistors, affect characteristics of the circuit. Thus, addition of capacitor-switching devices increases the number of load elements of the circuit, thereby increasing the causes of the device variation. Namely, since such addition affects the circuit characteristics, design difficulty is increased. Thus, use of an analog circuit to support a low-speed clock to a high-speed clock increases the circuit size and the design difficulty. Thus, there is much to be desired in the art.

According to a first aspect of the present invention, there is provided a clock data recovery circuit comprising: a detection circuit that detects whether D1≠D2 and D1≠D3, provided that logical values of an input data signal sampled at timings t1, t2, and t3 where t2<t1<t3 of edges of a clock signal are D1, D2 and D3, respectively; and a clock generation circuit that changes a phase of the clock signal based on detection results from the detection circuit, so that timings at which the logical values of the input data signal change correspond to the timings t2 and t3.

The meritorious effects of the present invention are summarized as follows.

According to the present invention, high and low data rates can be supported with a simple circuit.

PREFERRED MODES

In the present invention, there are various possible modes, which include the followings.

Mode 1: A clock data recovery circuit as mentioned at the first aspect.

Mode 2: The clock data recovery circuit according to Mode 1 may further comprise: a filter circuit that decreases a counter value upon receiving a first instruction signal and increases the counter value upon receiving a second instruction signal; and a control circuit that outputs a phase control signal based on the counter value of the filter circuit, wherein the detection circuit may supply the filter circuit with a first instruction signal when D1≠D2 and the second instruction signal when D1≠D3, and wherein the clock generation circuit may generate a clock signal whose phase is changed based on the phase control signal.

Mode 3: The clock data recovery circuit according to Mode 2, wherein the filter circuit may comprise a counter that performs up and down operations based on the first and second instruction signals.

Mode 4: The clock data recovery circuit according to Mode 1, wherein the clock signal may comprise first and second clock signals having opposite phases to one another, and wherein, when the detection circuit is set in a first operation mode, a timing of an edge of the first clock signal may be a timing t1, timings of edges of the second clock signal sandwiching the timing t1 may be timings t2 and t3, and when the detection circuit is set in a second operation mode, timings of three temporally consecutive edges of the first clock signal may be timings t2, t1, and t3.

Mode 5: The clock data recovery circuit according to Mode 4, wherein the first operation mode may be a normal mode, and the second operation mode may be a low-speed data transfer mode.

A clock data recovery circuit according to an exemplary embodiment of the present invention comprises: a detection circuit 11 (FIG. 1) for detecting whether D1≠D2 and D1≠D3, respectively, assuming that logical values of an input data signal sampled at timings t1, t2 and t3 (t2<t1<t3) of edges of a clock signal are D1, D2, and D3, respectively; and a clock generation circuit 14 (FIG. 1) for changing a phase of the clock signal based on detection results from the detection circuit, so that timings at which the logical values of the input data signal change correspond to the timings t2 and t3.

The clock data recovery circuit may further comprise: a filter circuit 12 (FIG. 1) for decreasing a counter value upon receiving a first instruction signal and increasing the counter value upon receiving a second instruction signal; and a control circuit 13 (FIG. 1) for outputting a phase control signal based on the counter value of the filter circuit. Further, the detection circuit may supply the filter circuit with the first instruction signal when D1≠D2 and the second instruction signal when D1≠D3, and the clock generation circuit may generate the clock signal of which phase is changed based on the phase control signal.

In the clock data recovery circuit, the filter circuit may comprise a counter that performs up and down operations based on the first and second instruction signals.

In the clock data recovery circuit, it is preferable that the clock signal comprises first and second clock signals having opposite phases with each other. Further, it is preferable that, when the detection circuit is set in a first operation mode (high-speed data transfer mode or normal mode), a timing of an edge of the first clock signal be a timing t1 and timings of edges of the second clock signal sandwiching the timing t1 be timings t2 and t3. Further, it is preferable that, when the detection circuit is set in a second operation mode (low-speed data transfer mode), timings of three temporally consecutive edges of the first clock signal be timings t2, t1, and t3.

Based on a data rate, the clock data recovery circuit switches the operation mode between (1) a first operation mode in which a data transition phase is detected by using two clock signals and comparing data sampled at a certain timing and data sampled before and after the data and (2) a second operation mode in which presence of a data change point is detected by using one of the two clock signals and comparing sampled data and data sampled before and after the data. This switching operation makes it possible to detect a change point at a low-speed data rate (1/2 or 1/4 of a high-speed data rate, for example) by using a simple circuit configuration, without change of a clock signal frequency.

The present invention will be hereinafter described in detail with reference to the drawings based on examples.

EXAMPLE 1

Figure 1:
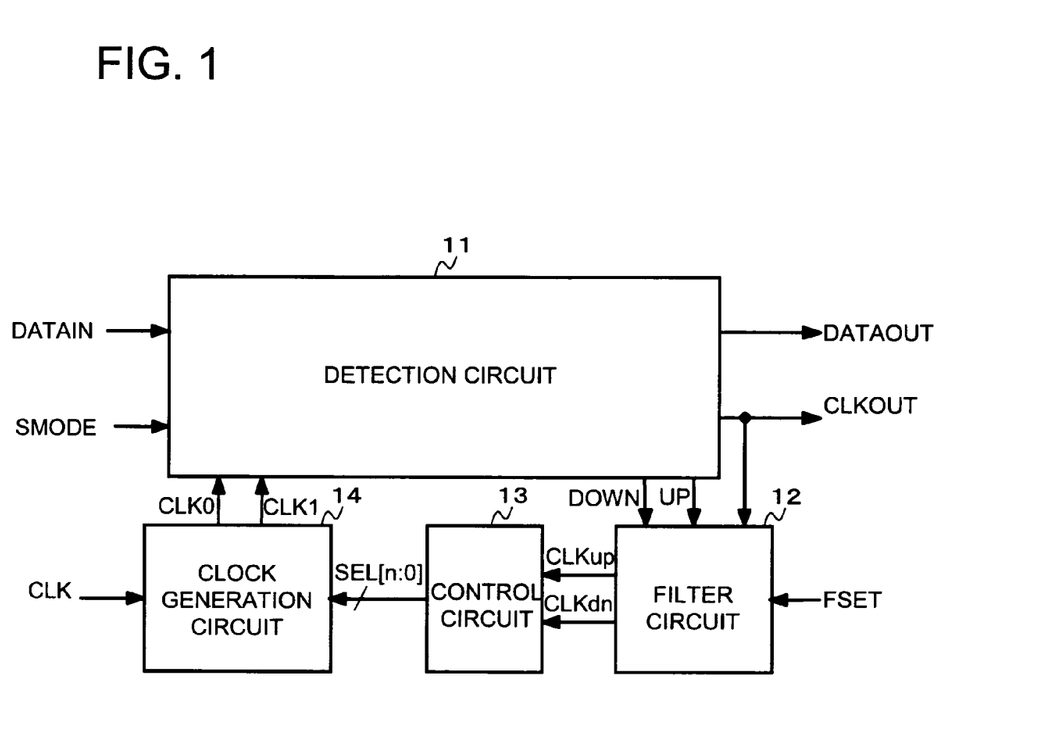
FIG. 1 is a block diagram illustrating a configuration of a clock data recovery circuit according to a first example of the present invention.

FIG. 1 is a block diagram illustrating a configuration of a clock data recovery circuit according to a first example of the present invention. In FIG. 1, the clock data recovery circuit comprises a detection circuit 11, a filter circuit 12, a control circuit 13, and a clock generation circuit 14.

The detection circuit 11 receives an input data signal DATAIN, which is serial data, and clock signals CLK0 and CLK1. The detection circuit 11 outputs: UP and DOWN signals, which are outputted based on the relationship between transition phases of the input data signal DATAIN and the clock signal CLK0 and CLK1; and an output data signal DATAOUT, which is data reproduced by latching the input data signal DATAIN with the clock signals CLK0 and CLK1. The detection circuit 11 buffers the clock signal CLK0 and outputs a clock signal CLKOUT. Further, the detection circuit 11 switches the operation mode based on a mode switching signal SMODE.

The filter circuit 12 receives the UP and DOWN signals and the clock signal CLKOUT from the detection circuit 11 and outputs instruction signals CLKup and CLKdn for giving instructions as to the clock phase change direction. The filter circuit 12 comprises an up/down counter or the like that increases a counter value thereof upon receiving the UP signal and decreases the counter value upon receiving the DOWN signal. The filter circuit 12 outputs the instruction signal CLKup when the counter value reaches a predetermined upper limit and the instruction signal CLKdn when the counter value reaches a predetermined lower limit. These predetermined counter values can be changed based on a setting signal FSET. In addition to the upper and lower limits, the up/down counter has an initial value between the upper and lower limits. When the filter circuit 12 outputs the instruction signal CLKup or CLKdn, the filter circuit 12 sets the counter value to the initial value. Namely, the filter circuit 12 functions as a filter that absorbs small changes of the UP and DOWN signals and outputs the instruction signal CLKup and CLKdn when the UP and DOWN signal consecutively change, respectively.

The control circuit 13 receives the instruction signals CLKup and CLKdn and outputs a phase control signal SEL[n:0] for setting phases of the clock signals CLK0 and CLK1 outputted from the clock generation circuit 14.

The clock generation circuit 14 receives a reference clock signal CLK and the phase control signal SEL[n:0] and outputs the clock signals CLK0 and CLK1 of which phase is changed from the reference clock signal CLK based on the phase control signal SEL[n:0]. The clock generation circuit 14 may comprise a phase interpolator or the like. Alternatively, the clock generation circuit 14 may comprise a variable frequency oscillator that increases a frequency in response to the UP signal and decreases the frequency in response to the DOWN signal. For example, a voltage control oscillator (VCO) and a charge pump may be used.

Figure 2:
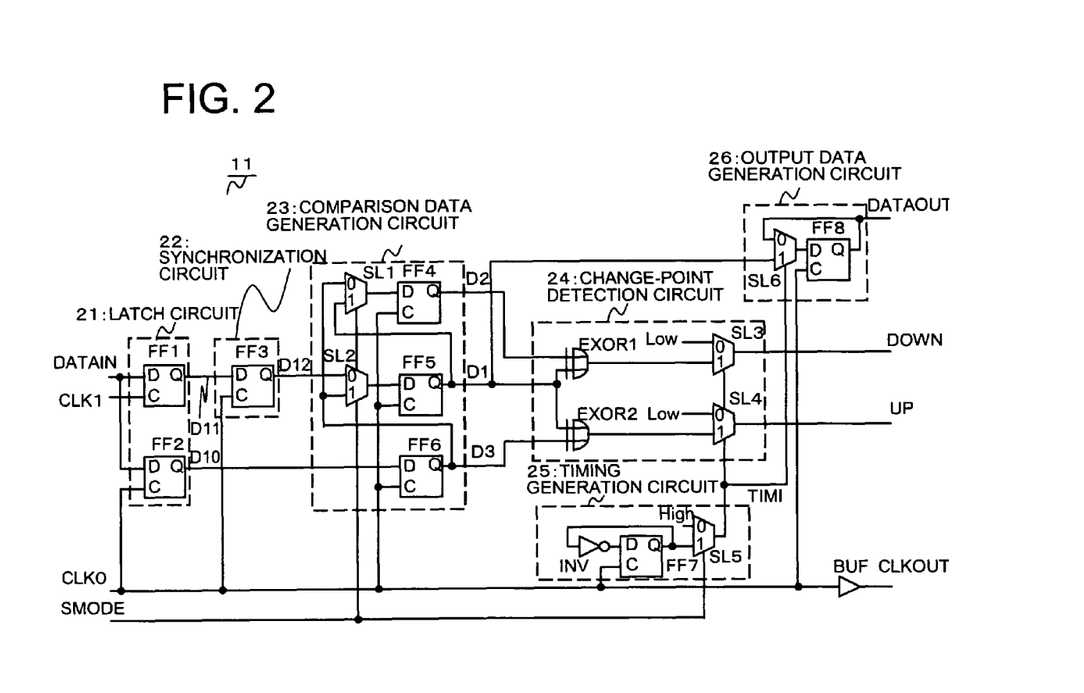
FIG. 2 is a circuit diagram of a detection circuit according to the first example of the present invention.

Next, the detection circuit 11 will be described in detail. FIG. 2 is a circuit diagram of the detection circuit 11, which comprises a latch circuit 21, a synchronization circuit 22, a comparison data generation circuit 23, a change-point detection circuit 24, a timing generation circuit 25, an output data generation circuit 26, and a buffer circuit BUF.

The latch circuit 21 comprises flip-flop circuits FF1 and FF2. The flip-flop circuits FF1 and FF2 latch the input data signal DATAIN at timings of rising edges of the clock signals CLK1 and CLK0 and output signals D11 and D10, respectively.

The synchronization circuit 22 comprises a flip-flop circuit FF3 and latches the signal D11 at the timing of a rising edge of the clock signal CLK0 for synchronization and outputs a signal D12.

The comparison data generation circuit 23 comprises selectors SL1 and SL2 and flip-flop circuits FF4 to FF6. The comparison data generation circuit 23 receives: a mode switching signal SMODE for switching the mode between a first operation mode (high data rate mode) and a second operation mode (low data rate mode); the signals D10 and D12 outputted from the flip-flop circuits FF2 and FF3, respectively, the signals being synchronized with the clock signal CLK0; and the clock signal CLK0. The flip-flop circuit FF6 receives and latches the signal D10 at the timing of a rising edge of the clock signal CLK0 and outputs a signal D3.

In a high data rate mode, the mode switching signal SMODE is at a low level, and the flip-flop circuit FF5 receives the signal D12 from the selector SL2. The flip-flop circuit FF5 then latches the signal D12 at the timing of a rising edge of the clock signal CLK0 and outputs a signal D1. Further, the flip-flop circuit FF4 receives the signal D3 from the selector SL1, latches the signal D3 at the timing of a rising edge of the clock signal CLK0, and outputs a signal D2.

In contrast, in a low data rate mode, the mode switching signal SMODE is at a high level, and the flip-flop circuit FF5 receives the signal D3 from the selector SL2. The flip-flop circuit FF5 latches the signal D3 at the timing of a rising edge of the clock signal CLK0 and outputs the signal D1. Further, the flip-flop circuit FF4 receives the signal D1 from the selector SL1, latches the signal D1 at the timing of a rising edge of the clock signal CLK0, and outputs a signal D2.

The timing generation circuit 25 comprises an inverter INV, a flip-flop circuit FF7, and a selector SL5. The timing generation circuit 25 receives the mode switching signal SMODE and the clock signal CLK0 and generates a timing signal TIMI for switching the mode between the high data rate mode and the low data rate mode. An output terminal Q and a D-terminal of the flip-flop circuit FF7 are connected via the inverter INV, so that the flip-flop circuit FF7 functions as a 1/2 frequency divider. The selector SL5 always outputs a high-level timing signal TIMI in the high data rate mode and outputs a signal obtained by dividing the frequency of the clock signal CLK0 by half in the low data rate mode.

The change-point detection circuit 24 comprises exclusive-OR circuits EXOR1 and EXOR2 and selectors SL3 and SL4 and receives the signals D1, D2 and D3 outputted from the comparison data generation circuit 23 and the timing signal TIMI outputted from the timing generation circuit 25. When the timing signal TIMI is valid (high level) and the exclusive-OR circuit EXOR1 determines that the signal D1 indicates a value different from that of the signal D2, the change-point detection circuit 24 outputs a high-level DOWN signal via the selector SL3. When the timing signal TIMI is valid (high level) and the exclusive-OR circuit EXOR2 determines that the signal D1 indicates a value different from that of the signal D3, the change-point detection circuit 24 outputs a high-level UP signal via the selector SL4. When the timing signal TIMI is invalid (low level), the DOWN and UP signals are maintained at a low level by the selectors SL3 and SL4, respectively;

The output data generation circuit 26 comprises a selector SL6 and a flip-flop circuit FF8 and receives the signal D1, the timing signal TIMI, and the clock signal CLK0. When the timing signal TIMI is valid (high level), the selector SL6 latches the signal D1, and the flip-flop circuit FF8 outputs the signal as an output data signal DATAOUT. When the timing signal TIMI is invalid (low level), the selector SL6 holds previously outputted data.

Next, an overall operation of the clock data recovery circuit will be described with reference to FIG. 1. In the following example, two-phase clock signals CLK0 and CLK1 are used.

In the first operation mode (high data rate mode), when the data rate of the input data signal DATAIN is n [Mbps], the frequency of the clock signals CLK0 and CLK1 is n [MHz]. The clock signals CLK0 and CLK1 are out of phase from one another by half clock cycle. Namely, the clock signals CLK0 and CLK1 have opposite phases with each other.

Further, three consecutive rising edges of the clock signals CLK0, CKL1, and CLK0 will be hereinafter referred to as timings t2, t1, and t3, respectively.

First, an operation of the clock data recovery circuit will be described based on cases where values of the input data signal DATAIN latched at the timings t1 and t2 are continuously different from each other. As described above, when values latched at the timings t1 and t2 are different from one another, the detection circuit 11 outputs the DOWN signal. This means that there is a data transition phase in the input data signal DATAIN between the timings t1 and t2. The filter circuit 12 decreases the value of the up/down counter every time the DOWN signal is supplied. When the value of the up/down counter reaches its minimum value, the filter circuit 12 outputs the CLKdn signal and sets the up/down counter to the initial value thereof.

Based on the CLKdn signal, the control circuit 13 supplies the clock generation circuit 14 with the phase control signal SEL[n:0] for delaying (lagging) the phases of the clock signals CLK0 and CLK1 currently outputted from the clock generation circuit 14. The clock generation circuit 14 receives the phase control signal SEL[n:0] and delays (lags) the phases of the clock signals CLK0 and CLK1. By repeating this operation, the values latched at the timings t1 and t2 are made equal to each other. This is because the timing t2 is shifted beyond the data transition phase and the data at the timings t2 and t1 are caused to have the same value.

When there is no data value transition, since the values of data latched at the timings t1 and t2 are equal to each other, the detection circuit 11 neither outputs the UP signal nor the DOWN signal.

In contrast, when the values of data latched at the timings t1 and t3 are continuously different, the detection circuit 11 outputs the UP signal, and the filter circuit 12 increases the value of the up/down counter. When the up/down counter reaches a predetermined maximum value, the filter circuit 12 outputs the CLKup signal and sets the up/down counter to the initial value thereof.

Based on the CLKup signal, the control circuit 13 outputs the phase control signal SEL[n:0] for advancing (leading) the phases of the current clock signals CLK0 and CLK1. The clock generation circuit 14 receives the phase control signal SEL[n:0] and advances (leads) the phases of the clock signals CLK0 and CLK1. By repeating this operation, the values of data latched at the timings t1 and t3 are made equal to each other. This is because the timing t3 is shifted beyond the data transition phase and the data at the timings t3 and t1 are caused to have the same value.

By repeating the above operations, each of the timings t2 and t3 follows a data transition phase in the input data signal DATAIN. Further, the generated clock signals CLK0 and CLK1 are synchronized with the input data signal DATAIN, whereby clock signals are reproduced.

In the second operation mode (low data rate mode), when the data rate of the input data signal DATAIN is n/2 [Mbps], the frequency of the clock signals CLK0 and CLK1 is n [MHz]. The detection circuit 11 generates the timings t1, t2, and t3 by using either the clock signal CLK0 or CLK1 and outputs the UP and DOWN signals.

Next, the first and second operation modes of the detection circuit 11 will be described.

Figure 3:
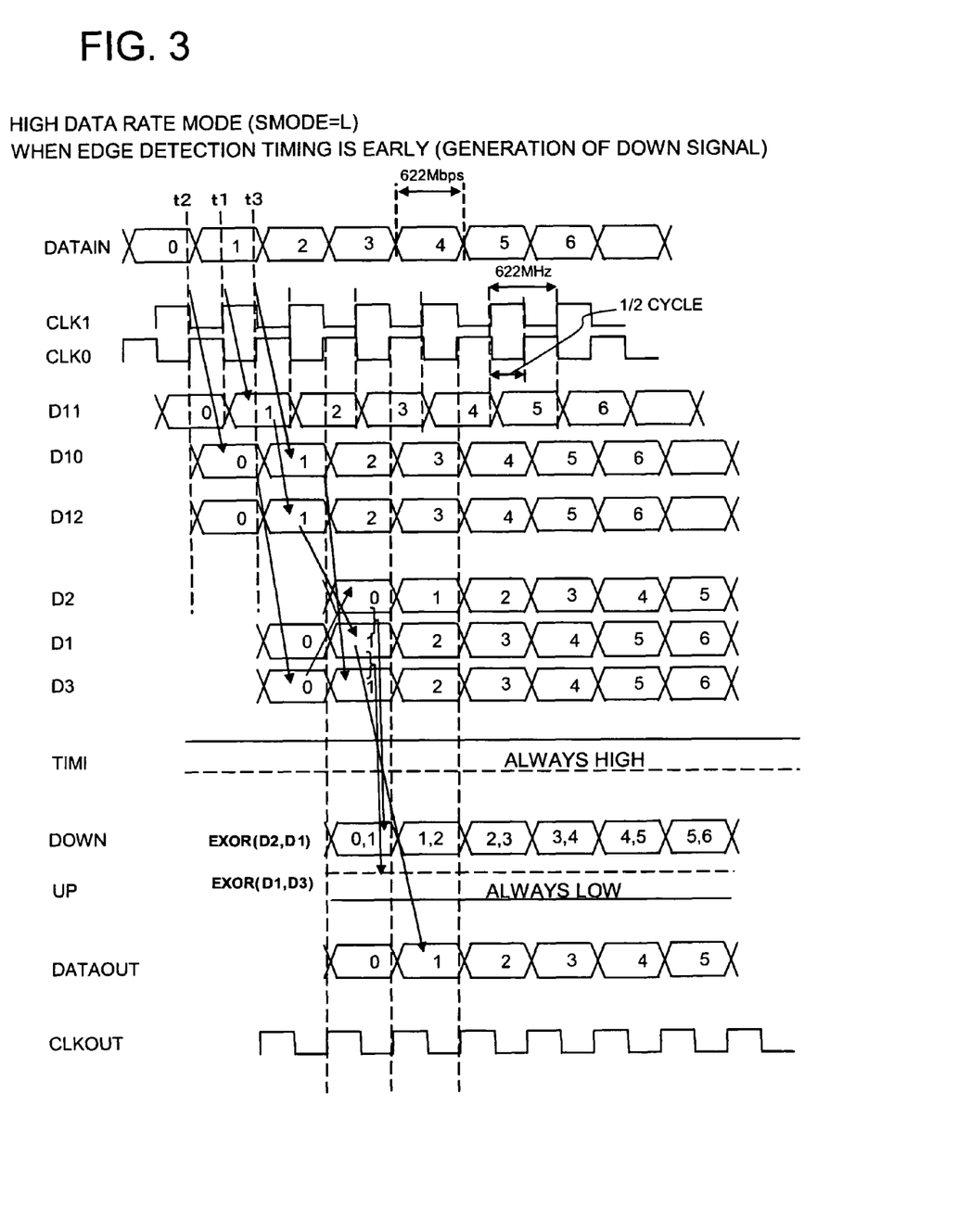
FIG. 3 is a timing diagram illustrating an operation of the detection circuit in a first operation mode (high data rate mode) when data latched at timings t1 and t2 indicates different values.

FIG. 3 is a timing diagram illustrating an operation of the detection circuit 11 in the first operation mode (high data rate mode) when data latched at the timings t1 and t2 indicates different values. The operation will be described assuming that the data rate of the input data signal DATAIN is 622 Mbps, the frequency of the clock signals CLK0 and CLK1 is 622 MHz, and the mode switching signal SMODE is at a low level.

The input data signal DATAIN is latched by the latch circuit 21 at rising edges (at the timings t2 and t1) of the clock signals CLK0 and CLK1 and is then outputted as signals D10 and D11, respectively. In this case, a timing at which an edge of the clock signal CLK1 rises is referred to as t1, a timing at which an edge of the clock signal CLK0 rises immediately before the timing t1 is referred to as t2, and a timing at which an edge of the clock signal CLK0 rises immediately after the timing t1 is referred to as t3.

The synchronization circuit 22 latches the signal D11 with the clock signal CLK0 at the timing t3 and outputs the signal D12 synchronized with the clock signal CLK0. Since the mode switching signal SMODE is at a low level, the selector SL2 in the comparison data generation circuit 23 selects and outputs input data "0." Based on this setting of the selector SL2, the signal D12 supplied from the synchronization circuit 22 is outputted from the comparison data generation circuit 23 as the signal D1, which is data latched at the timing t1. Regarding the signal D10, data latched at the timings t2 and t3 is transmitted to the flip-flop circuits FF6 and (further) FF4. The data latched at the timings t2 and t3 are outputted from the comparison data generation circuit 23 as signals D2 and D3, respectively. The signals D1, D2, and D3 are outputted at the same rising edge of the clock signal CLK0. When the mode switching signal SMODE is at a low level, the timing signal TIMI outputted from the timing generation circuit 25 is always at a high level.

The change-point detection circuit 24 performs an exclusive-OR operation on a pair of the signals D1 and D2 and a pair of the signals D1 and D3 to generate the DOWN and UP signals, respectively. In FIG. 3 the signals D1 and D3 always indicate the same value, and thus, the UP signal is always at a low level. When the signals D1 and D2 indicate data values different from each other (when the value of the input data signal DATAIN is changed), the change-point detection circuit 24 outputs a high-level DOWN signal. Further, since the timing signal TIMI is always at a high level, the signal D1, which is data latched at t1, is constantly latched by the clock signal CLK0 and is then outputted as the output data signal DATAOUT. Further, the clock signal CLK0 is buffered and is then outputted as the clock signal CLKOUT.

Figure 4:
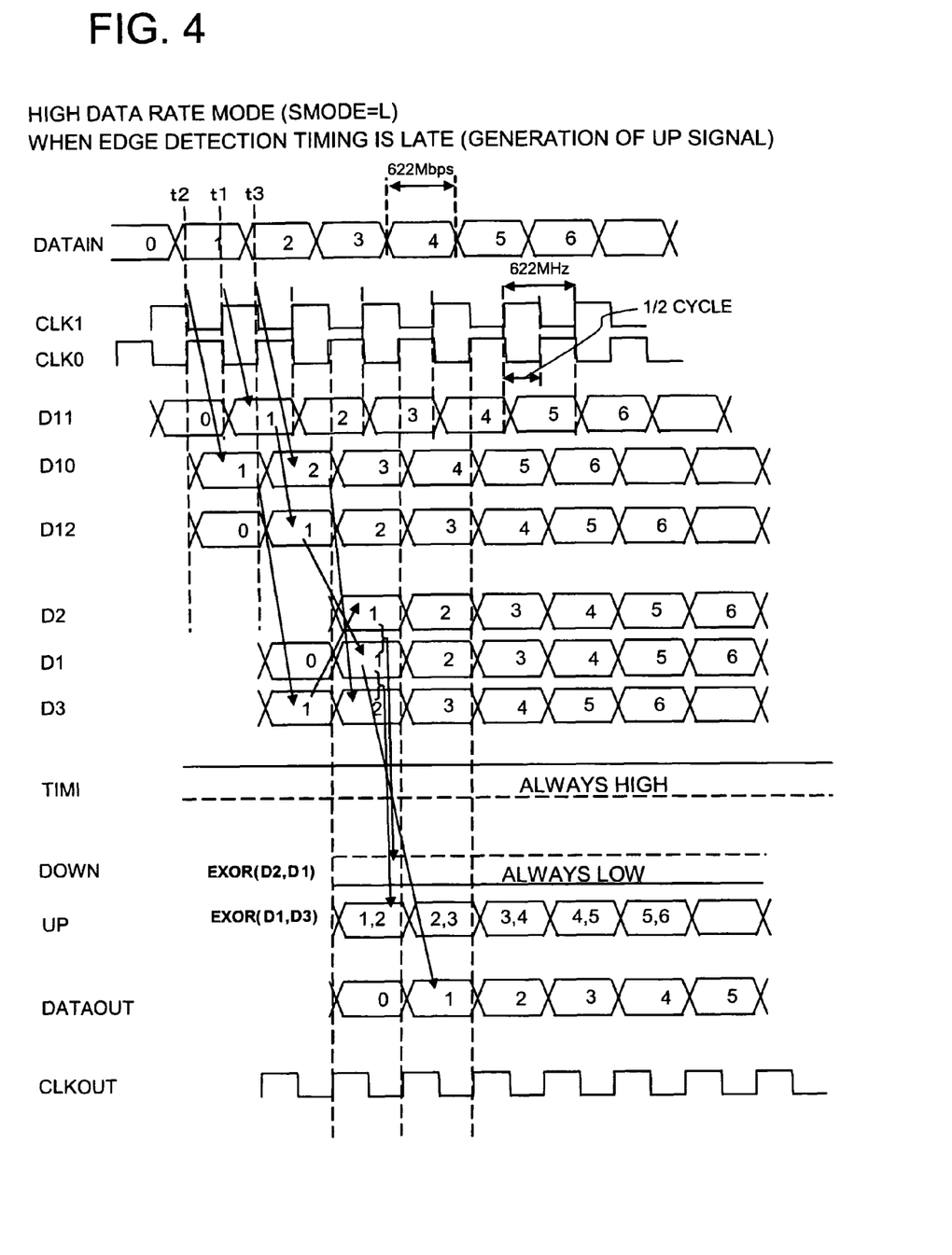
FIG. 4 is a timing diagram illustrating an operation of the detection circuit in the first operation mode (high data rate mode) when data latched at timings t1 and t3 indicates different values.

FIG. 4 is a timing diagram illustrating an operation of the detection circuit 11 in the first operation mode (high data rate mode) when data latched at the timings t1 and t3 indicates different values. The overall operation shown in FIG. 4 is generally the same as that shown in FIG. 3. However, in FIG. 4, the change-point detection circuit 24 always outputs a low-level DOWN signal when the signals D1 and D2 indicate the same value. The change-point detection circuit 24 outputs a high-level UP signal when the signals D1 and D3 indicate different data values (when the value of the input data signal DATAIN is changed). Further, since the timing signal TIMI is always at a high level, the signal D1, which is data latched at t1, is always latched by the clock signal CLK0 and is then outputted as the output data signal DATAOUT.

Figure 5:
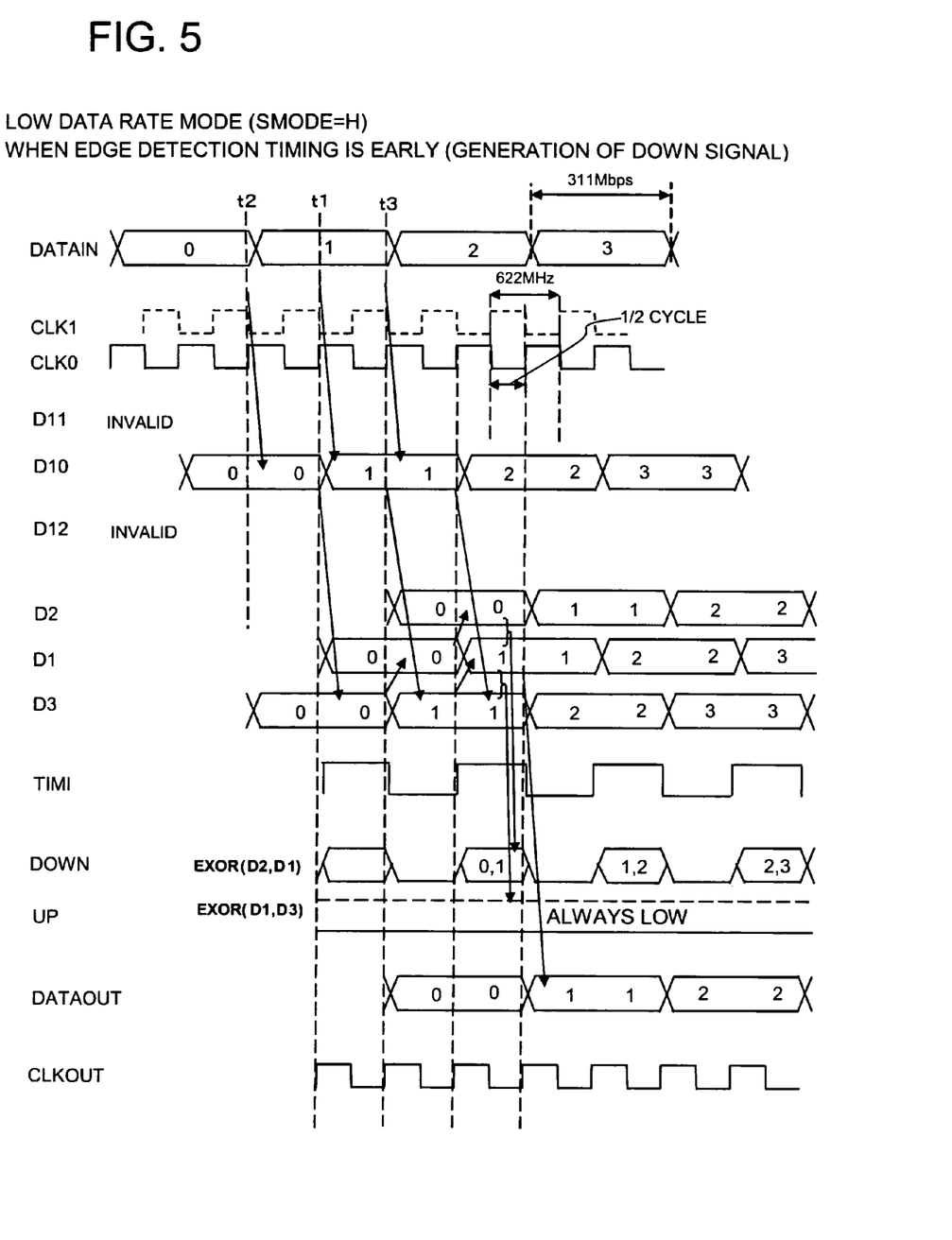
FIG. 5 is a timing diagram illustrating an operation of the detection circuit in a second operation mode (low data rate mode) when data latched at the timings t1 and t2 indicates different values.

FIG. 5 is a timing diagram illustrating an operation of the detection circuit 11 in the second operation mode (low data rate mode) when data latched at the timings t1 and t2 indicates different values. The operation will be described assuming that the data rate of the input data signal DATAIN is 311 Mbps, the frequency of the clock signals CLK0 and CLK1 is 622 MHz (the same as that of FIG. 3), and the mode switching signal SMODE is at a high level.

The input data signal DATAIN is latched by the latch circuit 21 at a rising edge of the clock signal CLK0 and is then outputted as the signal D10. The signals D11 and D12, which are data latched by the clock signal CLK1 in the first operation mode, are not used (invalid) in the second operation mode.

Since the mode switching signal SMODE is at a high level, the selectors SL1 and SL2 in the comparison data generation circuit 23 output input data "1." The signal D10 is transmitted to the flip-flop circuits FF6, FF5, and FF4 and outputted as the signals D3, D1, and D2, respectively. Since the mode switching signal SMODE is at a high level, the timing generation circuit 25 outputs the timing signal TIMI that alternately repeats 1 (high level) and 0 (low level), each level corresponding to a cycle of the clock signal CLK0.

When the timing signal TIMI is at a high level, the change-point detection circuit 24 performs an exclusive-OR operation on a pair of the signals D1 and D2 and a pair of the signals D1 and D3 to output the DOWN and UP signals, respectively. When the timing signal TIMI is at a low level, the UP and DOWN signals are always maintained at a low level.

In the second operation mode, the timings t1, t2, and t3 are determined by the timing signal TIMI. In this case, a timing at which an edge of the clock signal CLK0 rises when the timing signal TIMI is brought to a high level is referred to as t1. The rising edges of the clock signal CLK0 immediately before and after the timing t1 are referred to as t2 and t3, respectively.

When the timing signal TIMI is at a high level, since the signals D1 and D3 always indicate the same value, the UP signal is always maintained at a low level.

When the timing signal TIMI is at a high level and the signals D1 and D2 indicate different values (when the value of the input data signal DATAIN is changed), the change-point detection circuit 24 outputs a high-level DOWN signal.

When the timing signal TIMI is at a high level, the output data generation circuit 26 latches the signal D1, and when the timing signal TIMI is at a low level, the output data generation circuit 26 holds a latched value. In this case, the latched data is data obtained by latching the input data signal DATAIN at the timing t1. By outputting the data latched at the timing t1 for 2 clocks of 622 MHz as the output data signal DATAOUT, 311 Mbps data is reproduced and outputted.

Figure 6:
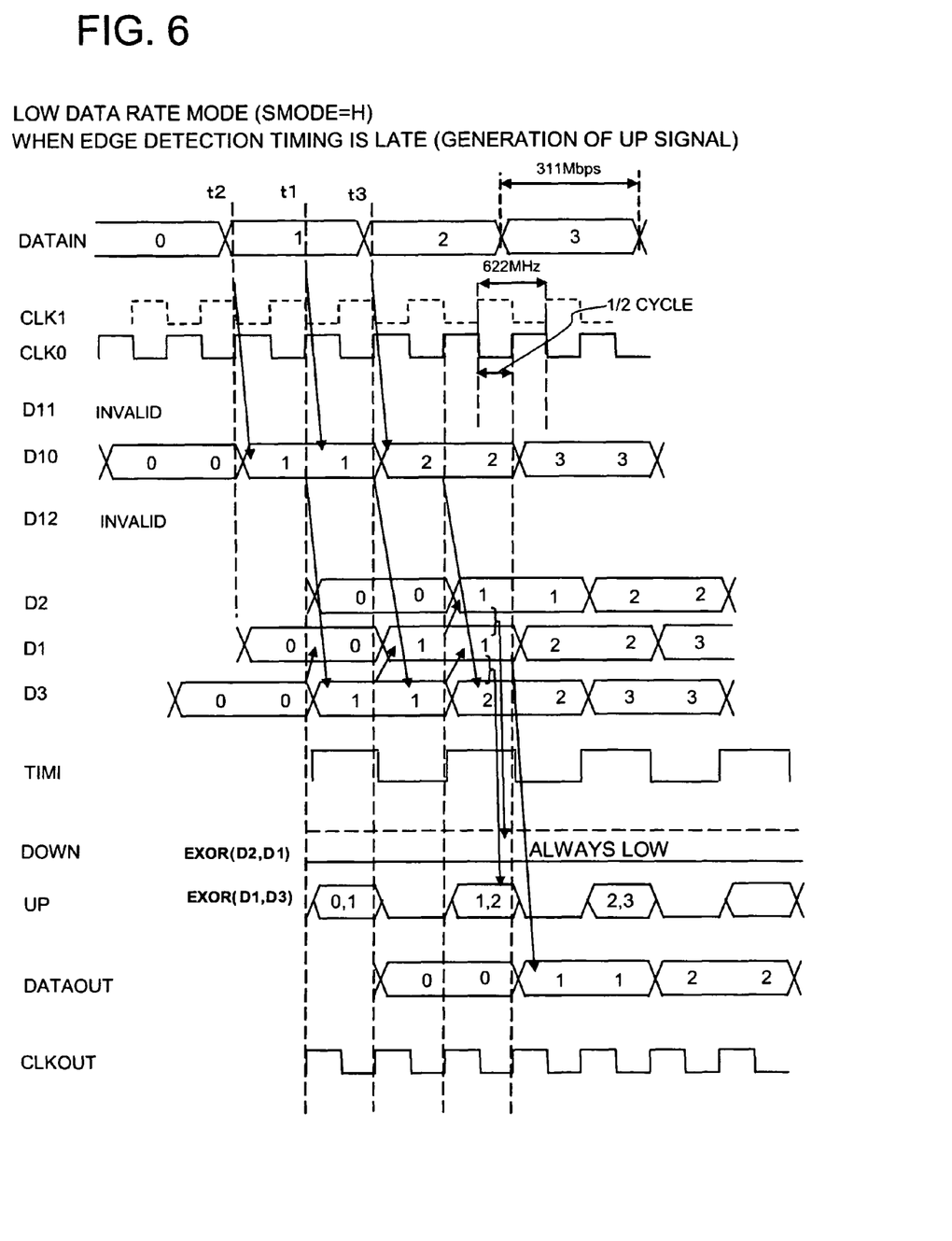
FIG. 6 is a timing diagram illustrating an operation of the detection circuit in the second operation mode (low data rate mode) when data latched at the timings t1 and t3 indicates different values.

FIG. 6 is a timing diagram illustrating an operation of the detection circuit 11 in the second operation mode (low data rate mode) when data latched at t1 and t3 indicate different values. The overall operation shown in FIG. 6 is generally the same as that shown in FIG. 5. However, in FIG. 6, when the timing signal TIMI is at a high level, the signals D1 and D2 always indicate the same value, and the DOWN signal is always at a low level. When the timing signal TIMI is at a high level and the signals D1 and D3 indicate different values (when a data value is changed), the change-point detection circuit 24 outputs a high-level UP signal. The output data generation circuit 26 operates as described with reference to FIG. 5.

Thus, in the second operation mode (low data rate mode), the clock data recovery circuit can operate at a half data rate using the same clock signal frequency, (i.e.,) without change of a clock signal frequency.

The entire disclosure of the above Patent Document and the like is incorporated herein by reference thereto. Modifications and adjustments of the exemplary embodiment and example are possible within the scope of the overall disclosure (including the claims) of the present invention and based on the basic technical concept of the present invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A clock data recovery circuit comprising:
    a detection circuit that detects whether a first logical value D1 is not equal to a second logical value D2, and whether the first logical value D1 is not equal to a third logical value D3, provided that an input data signal sampled at edges of a clock signal at timings t1, t2, and t3 are the logical values D1, D2 and D3, respectively; and
    a clock generation circuit that changes a phase of the clock signal based on detection results from the detection circuit, so that the timings at which the logical values of the input data signal change correspond to the timings t2 and t3,
    wherein timing t2<timing t1<timing t3,
    wherein the clock signal comprises first and second clock signals having opposite phases to one another, and
    wherein, when the detection circuit is set in a first operation mode, a timing of an edge of the first clock signal is a timing t1, timings of edges of the second clock signal sandwiching the timing t1 are timings t2 and t3, and when the detection circuit is set in a second operation mode, timings of three temporally consecutive edges of the first clock signal are timings t2, t1, and t3.

2. The clock data recovery circuit according to claim 1, further comprising:
    a filter circuit that decreases a counter value upon receiving a first instruction signal and increases the counter value upon receiving a second instruction signal; and
    a control circuit that outputs a phase control signal based on the counter value of the filter circuit,
    wherein the detection circuit supplies the filter circuit with the first instruction signal when logical value D1≠logical value D2 and the second instruction signal when logical value D1≠logical value D3, and
    wherein the clock generation circuit generates a clock signal whose phase is changed based on the phase control signal.

3. The clock data recovery circuit according to claim 2, wherein the filter circuit comprises a counter that performs up and down operations based on the first and second instruction signals.

4. The clock data recovery circuit according to claim 1, wherein the first operation mode comprises a normal mode, and the second operation mode comprises a low-speed data transfer mode.

* * * * *